United States Patent
Liaw

(10) Patent No.: US 7,440,303 B2
(45) Date of Patent: Oct. 21, 2008

(54) SEMICONDUCTOR MEMORY DEVICE

(75) Inventor: Corvin Liaw, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/724,057

(22) Filed: Mar. 14, 2007

(65) Prior Publication Data

US 2007/0211528 A1 Sep. 13, 2007

Related U.S. Application Data

(63) Continuation of application No. PCT/DE2005/001558, filed on Sep. 6, 2005.

(30) Foreign Application Priority Data

Sep. 14, 2004 (DE) .................. 10 2004 044 413

(51) Int. Cl.
*G11C 27/00* (2006.01)

(52) U.S. Cl. .................. 365/48; 365/46; 365/173

(58) Field of Classification Search .................. 365/158, 365/171, 173, 148, 163, 48, 46
See application file for complete search history.

(56) References Cited

U.S. PATENT DOCUMENTS

| 5,307,304 | A | 4/1994 | Saito et al. |
|---|---|---|---|
| 6,657,881 | B1 | 12/2003 | Rickes et al. |
| 6,801,448 | B2 | 10/2004 | Hsu |
| 7,057,922 | B2 * | 6/2006 | Fukumoto ............... 365/158 |
| 2003/0002333 | A1 * | 1/2003 | Hidaka ................ 365/171 |
| 2003/0067800 | A1 * | 4/2003 | Koganei ............... 365/158 |
| 2003/0119212 | A1 | 6/2003 | Nishihara et al. |
| 2003/0223292 | A1 | 12/2003 | Nejad et al. |
| 2004/0161888 | A1 | 8/2004 | Rinerson et al. |
| 2005/0122768 | A1 * | 6/2005 | Fukumoto ............... 365/158 |

FOREIGN PATENT DOCUMENTS

| DE | 103 12 262 A1 | 12/2003 |
|---|---|---|
| EP | 0 469 934 A2 | 2/1992 |
| EP | 1 424 697 A2 | 6/2004 |

OTHER PUBLICATIONS

Symanczyk, R., et al., "Electrical Characterization of Solid State Ionic Memory Elements," Non-Volatile Memory Technology Symposium, 2003, 7 pages.

* cited by examiner

*Primary Examiner*—Richard T. Elms
*Assistant Examiner*—Han Yang
(74) *Attorney, Agent, or Firm*—Slater & Matsil, L.L.P.

(57) ABSTRACT

A semiconductor memory device includes resistance memory elements that are coupled to selection transistors addressed by word lines and bit lines. The memory elements are read by read/write lines arranged parallel to the word lines. Two successive memory elements along a read/write line are coupled to selection transistors that are coupled to different word lines.

20 Claims, 8 Drawing Sheets

SEMICONDUCTOR MEMORY DEVICE

This application is a continuation of co-pending International Application No. PCT/DE2005/001558, filed Sep. 6, 2005, which designated the United States and was not published in English, and which is based on German Application No. 10 2004 044 413.7, filed Sep. 14, 2004, both of which applications are incorporated herein by reference.

TECHNICAL FIELD

The present invention relates generally to semiconductor memory devices.

BACKGROUND

Semiconductor memory devices have a matrix-like arrangement of memory cells in columns and rows which are addressed via word lines running along the rows and bit lines running along the columns. Among a multiplicity of possible memory media, also suitable is a programmable electrical resistance such as is formed, for example, by solid-state ionic memory elements. Memory elements of this type are described, for example, in the publication by R. Symanczyk, et al., "Electrical Characterization of Solid State Ionic Memory Elements", Non-volatile Memory Technology Symposium 2003. They comprise, e.g., a thin film of a silver-doped chalcogenide or oxide glass as solid electrolyte between a silver anode and a cathode composed of a chemically inert material. If an electrical voltage of suitable polarity is applied to the electrodes, electrons flow from the cathode to the anode and reduce a corresponding number of positive silver ions which emerge from the anode into the chalcogenide or oxide glass. As a result, a deposition composed of silver atoms is formed in the solid electrolyte, the silver atoms reducing the electrical resistance of the material. By applying an electrical voltage of opposite polarity, it is possible to reverse the deposition of the silver atoms in the solid electrolyte, with the result that the silver atoms are oxidized and transported back as ions into the silver anode and the electrical resistance of the material is thereby increased. The programming state—which is defined by the electrical resistance of the solid electrolyte—of a memory cell formed with such a memory element can thus be altered in a simple manner by application of suitable voltages.

In order to read out the content of a memory cell, it is necessary to have a further electrical resistance as a reference quantity, with which the present resistance value of the memory cell can be compared in order to ascertain whether the memory cell is programmed or not programmed. In the case of row-by-row addressing of the memory cells via a word line, however, all the memory cells of the relevant row are addressed, with the result that the bit lines arranged in columns are short-circuited onto the read lines or source lines. In order to be able to use a bit line as a reference bit line, it must not be driven with the same word line with which the memory cell to be read is also addressed, in order that the bit line can be coupled up with a separate reference resistance. In the case of a conventional arrangement of the memory cells in rows and columns with word lines correspondingly arranged in rows and bit lines arranged in columns, no bit line adjacent to a selected bit line can be coupled as the reference bit line. The reference resistance therefore has to be determined by means of a line arranged far away from the selected bit line. A noise level coupled into the lines can become apparent in disturbing fashion in this case. Moreover, additionally required reference bit lines increase the area requirement. Within the memory cell array, however, bit lines are already required for each memory cell present along a word line. The bit lines are usually produced in the second metallization level and determine the minimum structural fineness of the memory cell array.

SUMMARY OF THE INVENTION

It is an embodiment of the present invention to specify a semiconductor memory device in which the memory cells can be addressed together with comparison or reference elements and which does not have disadvantages of a high noise level or a large area requirement.

The semiconductor memory device has resistance memory elements which are arranged in rows and columns and which may be, in particular, the solid-state ionic memory elements described in the introduction, which are coupled to read/write lines running in rows, two successive memory elements along a read/write line being coupled to selection transistors that are coupled to different word lines. What is thereby achieved is that through the selection of a word line, only selection transistors are opened of which one selection transistor couples the selected bit line to the memory element to be read, but no selection transistor couples the memory elements that follow along the read/write line to a bit line, in particular not to a bit line adjacent to the selected bit line. It is therefore possible for the bit lines that are respectively adjacent to the selected bit line to be used as reference bit lines. On account of the adjacent arrangement of the selected bit line and the reference bit line, the influence of coupled-in noise can be reduced.

In embodiments comprising a plurality of bit lines that are adjacent to the selected bit line and that are not coupled to the selection transistors addressed by the relevant word line, it is also possible to compare the addressed memory cell with a plurality of reference resistances, with the result that multi-level programming and hence multi-bit storage are possible. Moreover, it is possible to combine a plurality of bit lines in one bit line, or, to put it another way, each bit line can be provided simultaneously for a plurality of columns of memory elements, with the result that the bit line pitch can be increased. This is advantageous since the bit lines are embodied in a higher metallization. Each selection transistor driven via a word line can be coupled to a plurality of resistance memory elements. The memory elements then belong to different rows of the arrangement and are coupled to different read/write lines. In each exemplary embodiment, it is provided that no two memory elements that are coupled to the same selection transistor are coupled to the same read/write line.

In particularly preferred exemplary embodiments, it is provided that the totality of the memory elements is divided into groups comprising the same number of memory elements. The memory elements of the same group are coupled to the same selection transistor, it also being possible for a plurality of groups of memory elements to be coupled to the same selection transistor. The totality of the read/write lines is likewise divided into groups that comprise as many read/write lines as there are memory elements coupled to a respective selection transistor. Each group of read/write lines is coupled to groups of memory elements, such that, from all the groups of memory elements of which a memory element is coupled to one read/write line of said group, each memory element is coupled to another read/write line of said group. That is to say that the read/write lines are grouped in a manner corresponding to the groups of the memory elements.

BRIEF DESCRIPTION OF THE DRAWINGS

Examples of the semiconductor memory device are described in more detail below with reference to the accompanying FIGS. 1 to 8.

DETAILED DESCRIPTION OF ILLUSTRATIVE EMBODIMENTS

Figure 1:
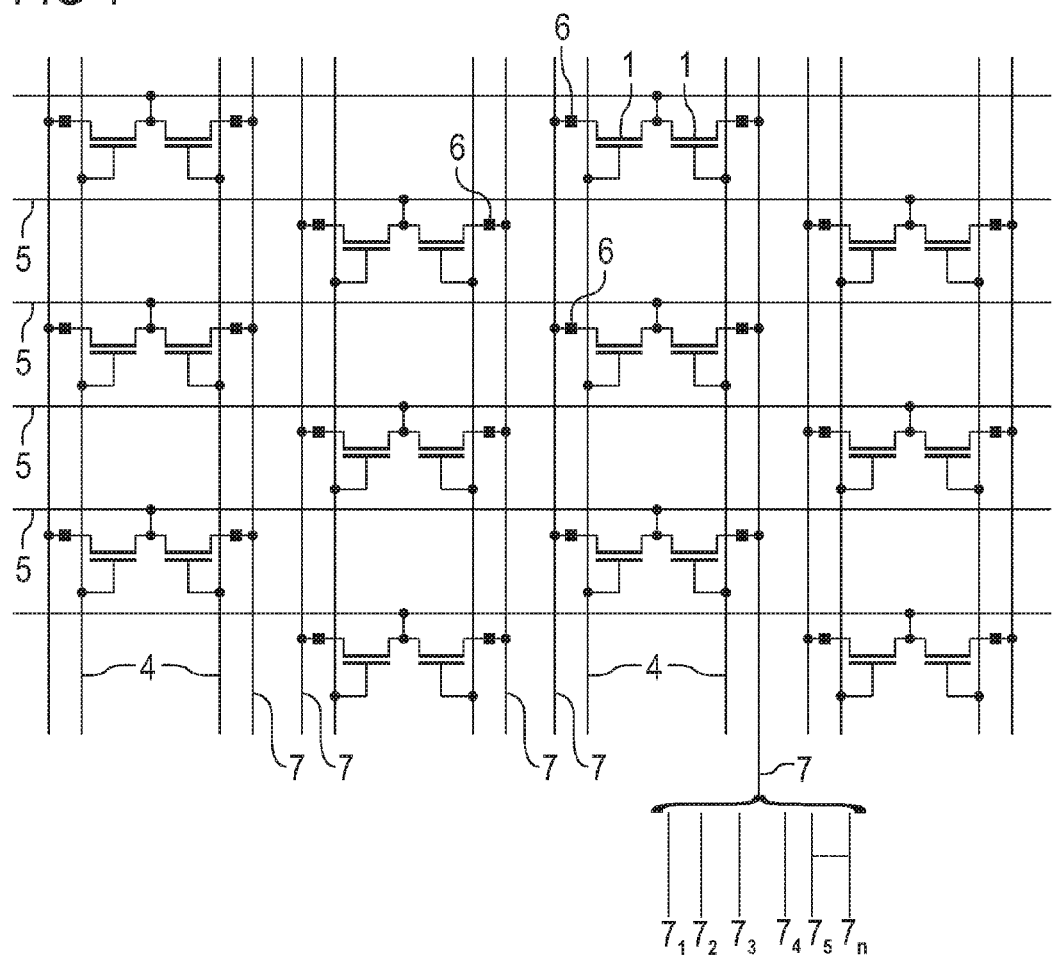
FIG. 1 shows a circuit schematic for a first embodiment of the device.
Figure 2:
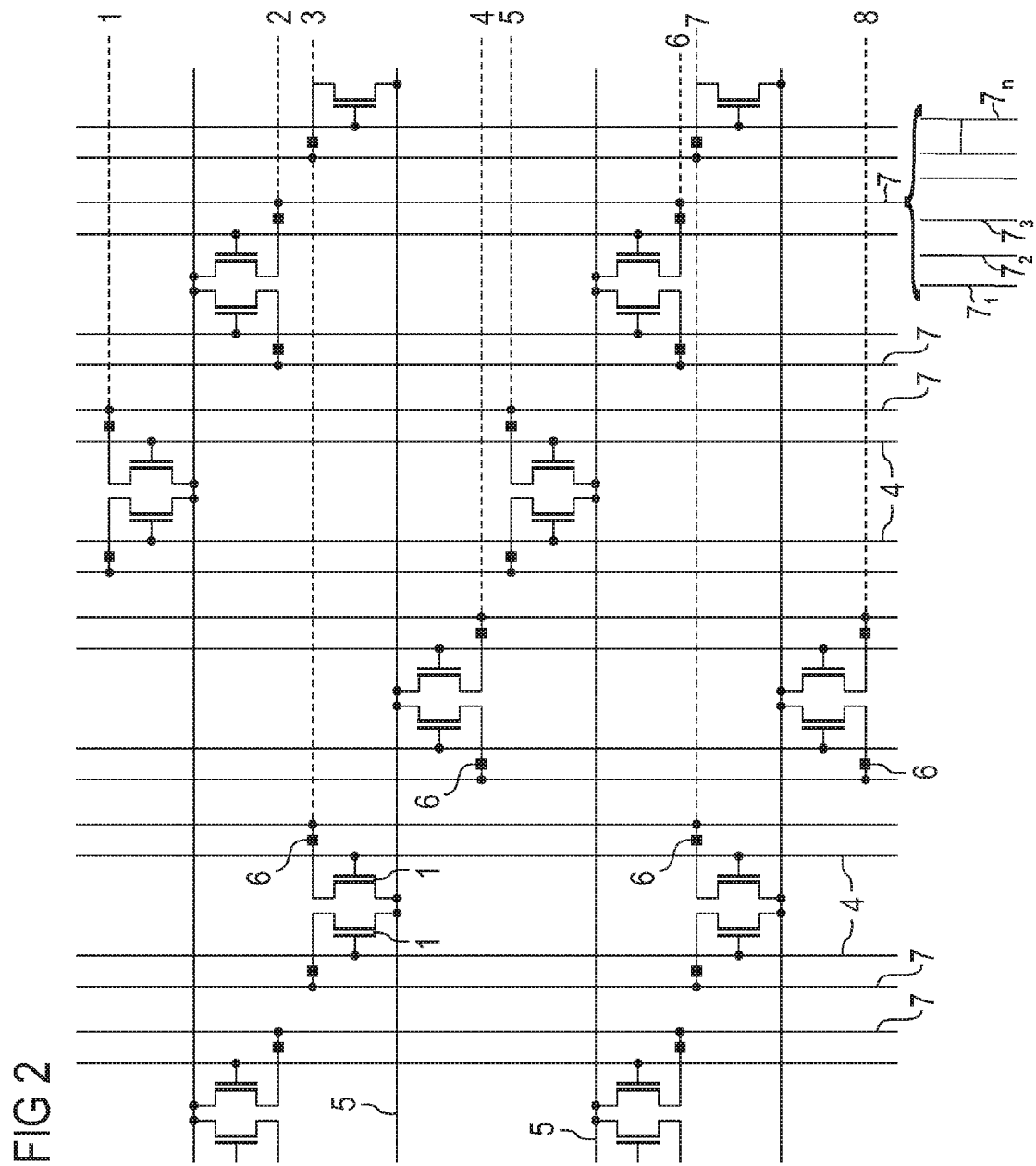
FIG. 2 shows a circuit schematic for an exemplary embodiment with bit lines which are provided for two columns.
Figure 3:
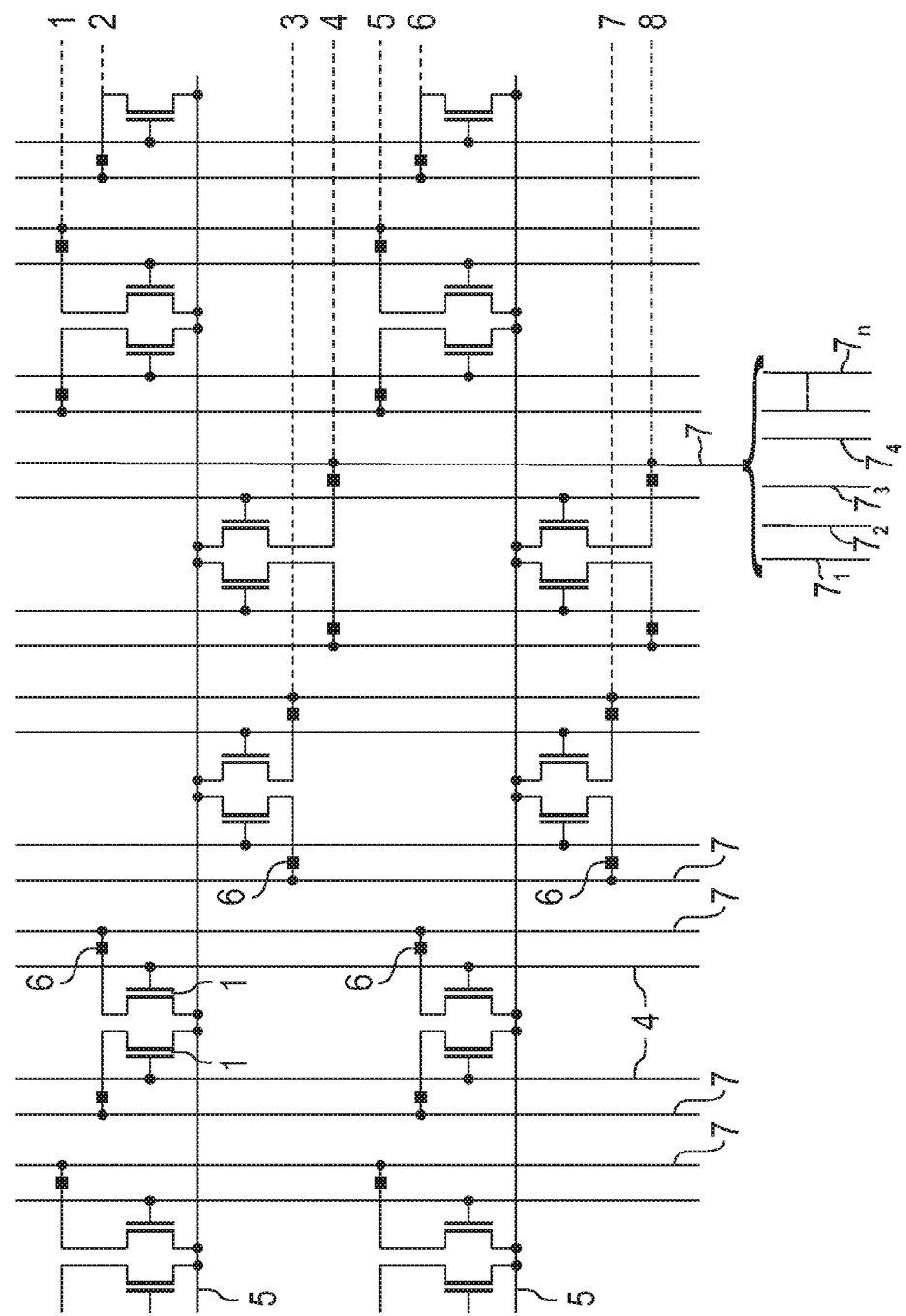
FIG. 3 shows a circuit schematic for another exemplary embodiment, in which the bit lines are provided for four columns.

In the circuit schematics of FIGS. 1 to 3, the word lines are depicted vertically and the bit lines are depicted horizontally. The orientation of the word lines and bit lines is therefore rotated 90° relative to the customary representations. The memory elements are represented by small black squares coupled between a respective selection transistor and a respective read/write line.

FIG. 1 shows a circuit schematic comprising word lines 4, bit lines 5 and read/write lines 7 for an exemplary embodiment chosen in particularly simple fashion for elucidation purposes. The word lines 4 are coupled in rows to the gate electrodes of the selection transistors 1. Each selection transistor 1 is coupled in pairs by one of their source/drain regions to one of the bit lines 5. A memory element 6 is coupled between the respective other source/drain region and at least one associated read/write line 7. A plurality of memory elements 6 may be coupled in parallel to each selection transistor 1, the memory elements being read via mutually independent read/write lines. In order to simplify the illustration, only one memory element 6 and only one associated read/write line are depicted for each selection transistor in the schematic of FIG. 1. The depicted pairs of selection transistors 1 are coupled to two adjacent word lines 4. In the direction along the word lines 4, the successive selection transistors are coupled to next-but-one bit lines 5. If one of the word lines 4 is selected for the addressing of a memory cell and a suitable electrical potential is applied to the selected word line 4 for this purpose, all the selection transistors of the relevant row are switched. As a result, however, not all the bit lines 5 are coupled via the source-channel-drain path of the relevant selection transistors to the read/write line 6 of the relevant row, but rather only the respective next-but-one bit lines are. Therefore, situated between two bit lines there is always one bit line that is only coupled to selection transistors that are not addressed via the relevant selected word line 4. Therefore, in the case of this schematic, it is possible to use a bit line adjacent to a selected bit line as a reference bit line that can be coupled up with a reference resistance.

FIG. 2 shows an alternative circuit schematic, in which, in comparison with the circuit schematic of FIG. 1, two mutually adjacent bit lines are combined to form one bit line. In this case, too, the selection transistors along a respective word line are coupled to next-but-one bit lines. The excerpt in FIG. 2 reproduces eight columns of memory elements that are consecutively numbered with the numerals from 1 to 8 at the right-hand edge for illustration purposes. It can by discerned from this that each bit line in the case of this circuit schematic in accordance with FIG. 2 is provided for the memory elements in two mutually adjacent columns. The memory elements addressed via a selection transistor need not be present only in one row, as in the schematic illustration of FIG. 2, but rather may be arranged in a plurality of, preferably successive, rows. The read/write lines can be coupled in the case of densely arranged memory elements in each column to a memory element. This is explained in more detail with reference to the exemplary embodiment of FIG. 7.

FIG. 3 shows a further circuit schematic, in which the number of bit lines is once again halved. The bit line 5 depicted at the top is in this case provided for the addressing of the memory elements in the columns 1, 2, 3 and 4, while the bit line 5 depicted at the bottom is provided for the subsequent columns 5, 6, 7 and 8. The bit lines are in this case arranged such that two of the associated columns of memory elements are present on both sides. Instead of this, however, there may be only one column of memory elements present on one side, while there are three columns of memory elements present on the opposite side of the associated bit line. Finally, the bit line may also be arranged in such a way that all the memory elements coupled thereto lie on the same side of the bit line. Although the successive selection transistors 1 along a respective word line 4 are coupled to mutually adjacent bit lines 5 in the case of this arrangement, the memory elements arranged in mutually adjacent columns are read via selection transistors which are driven via different word lines. In this case, the bit lines that are adjacent to a selected bit line cannot be coupled as reference bit lines. The bit line pitch can thus be increased.

Figure 4:
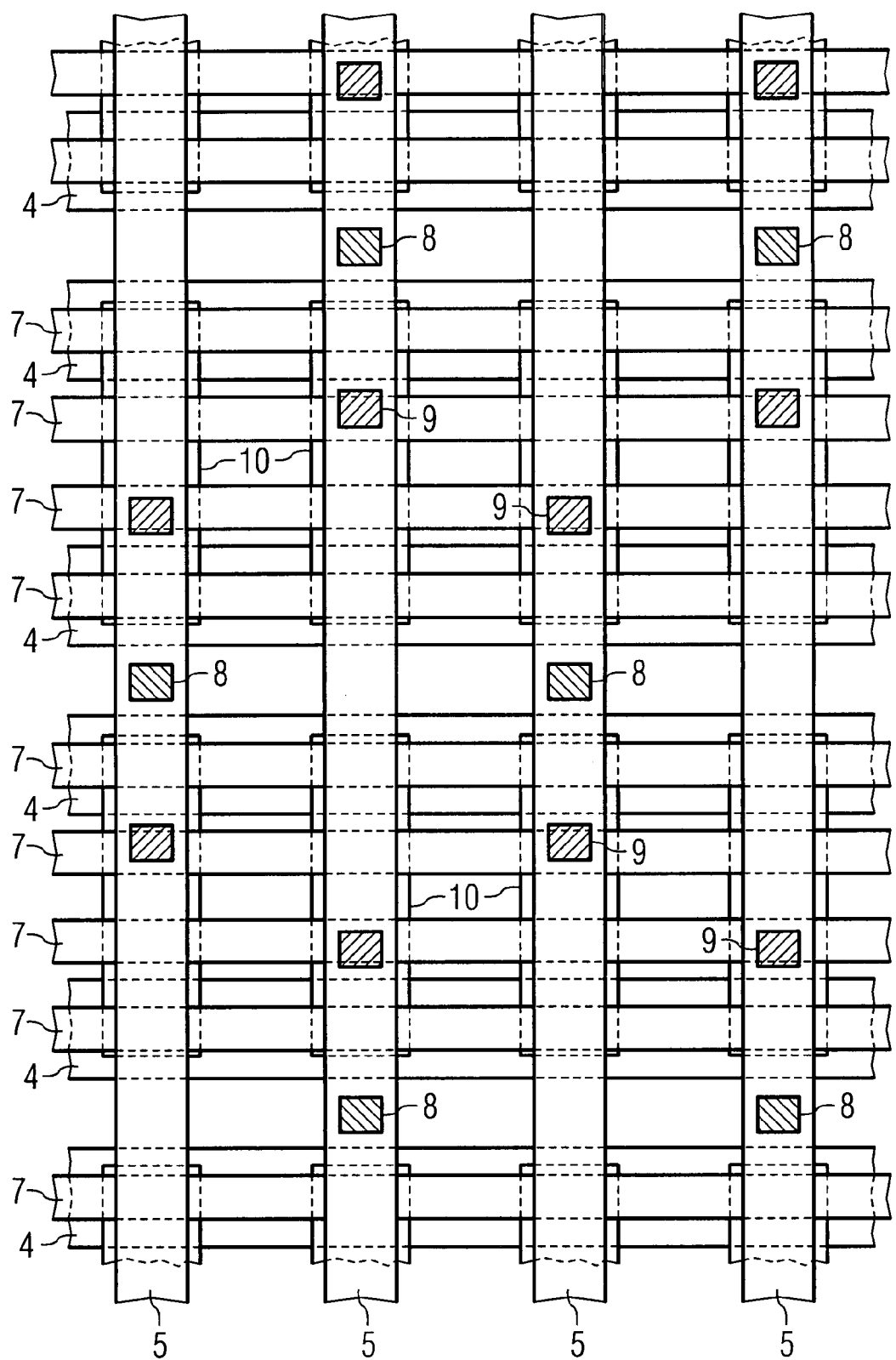
FIG. 4 shows an excerpt from a plan view of a device with the arrangement of the bit lines, word lines and read/write lines.

FIG. 4 shows a semiconductor memory device in plan view with the word lines 4, the bit lines 5 and the read/write lines 7, in which the interconnection of the memory elements with these lines corresponds to the circuit schematic of FIG. 1. The bit lines 5 are electrically contact-coupled by means of connection contacts 8 on the doped regions for the source and drain, respectively, of each selection transistor. In this exemplary embodiment, four memory elements are provided for each selection transistor driven via a word line 4, said memory elements being coupled to the associated four read/write lines 7. The memory elements are resistance elements having two connections, of which one is coupled to the relevant read/write line and the other is coupled to a source/drain region of the relevant selection transistor, for which the further connection contacts 9 are provided. For the purpose of better distinguishing them, the connection contacts 8 of the bit lines are hatched from top left to bottom right, while the further connection contacts 9 of the connection areas 10 are hatched from bottom left to top right. The further connection contacts 9 are coupled to a connection area 10 which may be formed, e.g., in a first metallization level. The memory elements have one of their connections arranged and electrically contact-coupled on said connection area 10. Therefore, the four memory elements which are assigned to a selection transistor can be coupled via the connection areas 10. The number of memory elements selected by means of each selection transistor is four in this example; however, this number is arbitrary, in principle. In the exemplary embodiment illustrated, the totality of the memory elements 6 is divided into groups in a manner corresponding to the connection areas 10, with the result that no two memory elements 6 of the same group are coupled to the same read/write line 7. All the memory elements 6 of a group are coupled to the same selection transistor 1, and the read/write lines 7 that are coupled to the memory elements 6 of the same group are coupled to further memory elements 6 in such a way that, from all the groups of memory elements 6 of which a memory element is coupled to one of said read/write lines 7, each memory element is coupled to another of said read/write lines 7.

Figure 5:
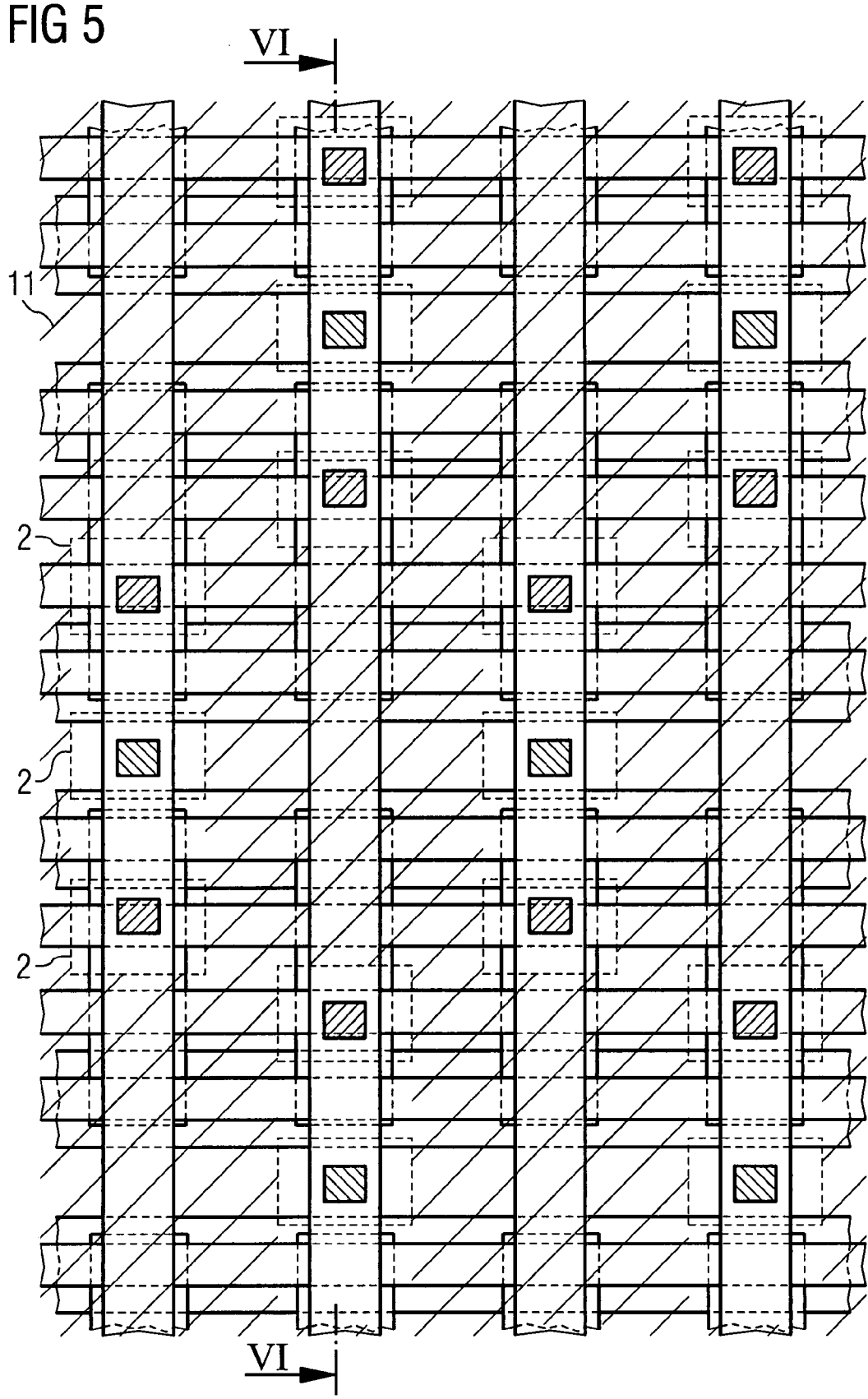
FIG. 5 shows the plan view in accordance with FIG. 4, supplemented by the arrangement of the doped regions and the isolation regions in the semiconductor body.

The structure shown in FIG. 4 is once again illustrated in FIG. 5, in which the lateral boundaries of the source/drain regions 2 of the selection transistors are illustrated with concealed contours depicted in dashed fashion. A wider large-area hatching indicates the region in which the substrate can be provided with regions of an isolation 11, in particular an STI (shallow trench isolation). The isolation 11 does not extend between the source/drain regions 2 since the channel regions of the selection transistors are situated there.

Figure 6:
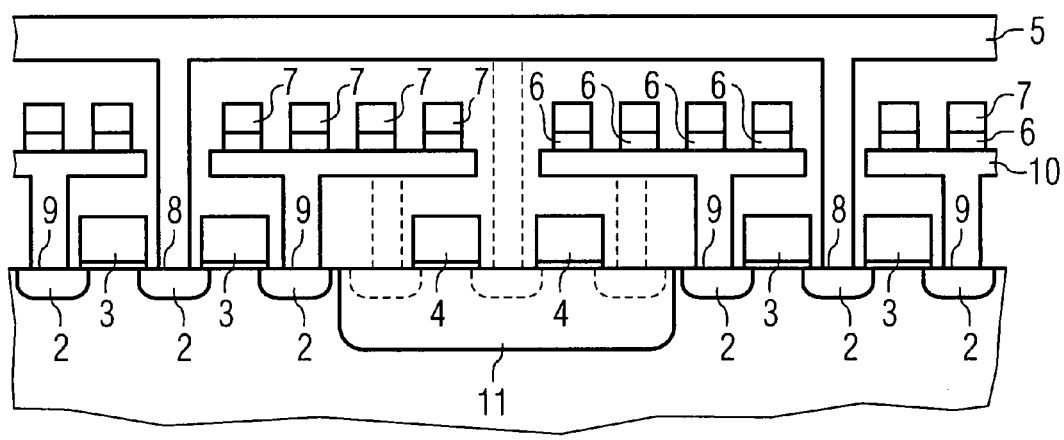
FIG. 6 shows an excerpt from a cross section through the device along a bit line.

For further elucidation of this exemplary embodiment, FIG. 6 illustrates the cross section through the device along the sectional line marked as VI in FIG. 5. The source/drain regions 2 of the selection transistors, the source/drain regions being arranged in the semiconductor body or substrate, are depicted in the cross section. The gate electrodes 3 above the channel regions, and electrically isolated from the latter by a gate dielectric, are coupled to one another by the word lines 4. The selection transistors are coupled in pairs to the bit line 5 from which lead vertical conductive connections to a connection contact 8 onto one of the source/drain regions 2 of the selection transistors. The cross section illustrated in FIG. 6 runs along the depicted bit line 5. Dashed contours are used to represent, in the central region, the arrangement of the vertical conductive connection and of the source/drain regions of the selection transistor which follows in the viewing direction but does not lie in the sectional plane. In the relevant region, the isolation 11 is situated within the sectional plane. The respective second source/drain region of the selection transistors is provided with the further connection contact 9, from which leads a vertical connection to the connection area 10, which in this case is arranged in the first metallization level. In this example, there are arranged on the connection area 10 four memory elements 6 which are contact-coupled above and are coupled to one another in rows parallel to the word lines 4, that is to say perpendicular to the plane of the drawing in FIG. 6, via the read/write lines 7. In the example of FIG. 6, four memory elements 6 are provided for each selection transistor. However, this number is arbitrary, in principle.

Figure 7:
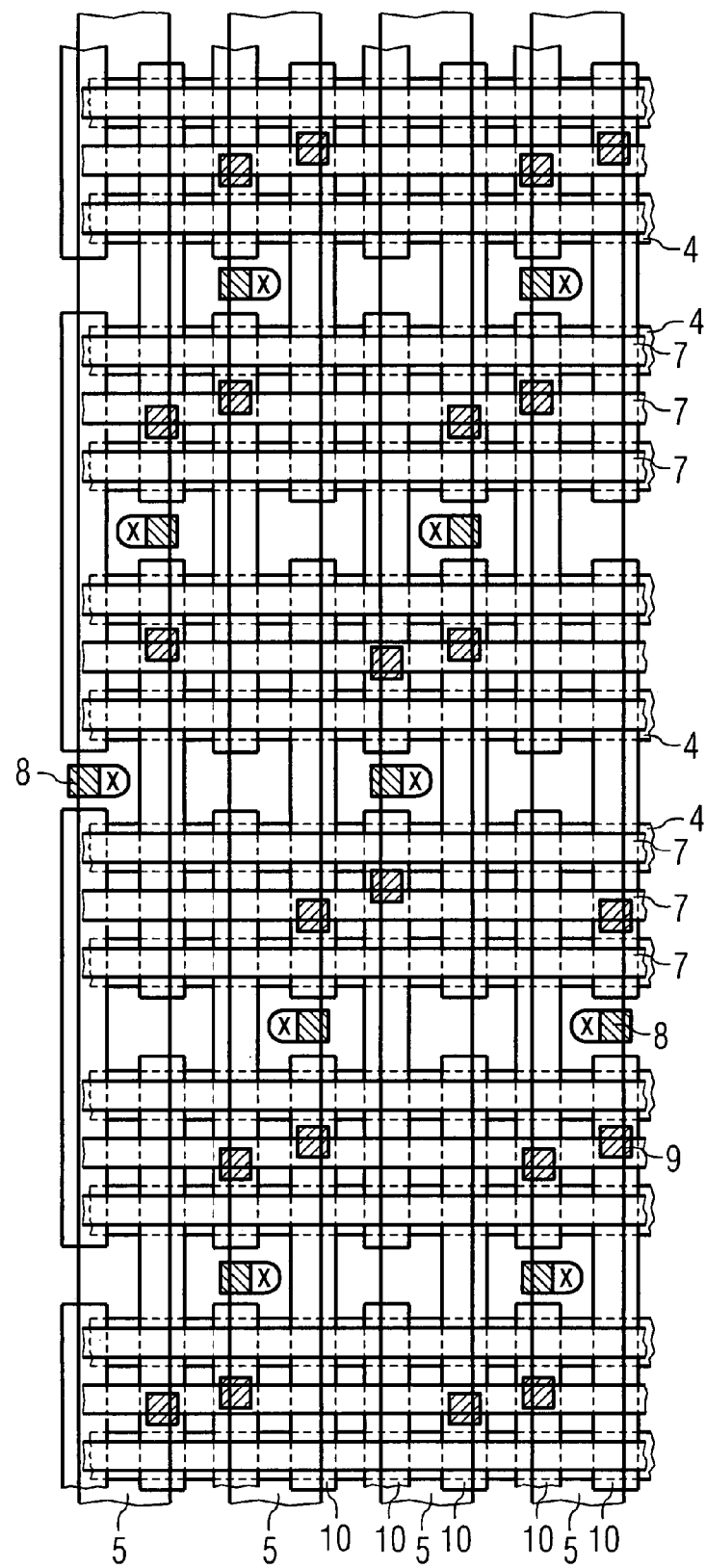
FIG. 7 shows a plan view in accordance with FIG. 4 for the exemplary embodiment in accordance with FIG. 2.

FIG. 7 illustrates a further exemplary embodiment in a plan view corresponding to FIG. 4. This embodiment corresponds to the circuit schematic of FIG. 2. The bit lines 5 make contact with the source/drain regions of the relevant selection transistors in the region between two mutually adjacent word lines 4. The contours of the word lines 4, the read/write lines 7 and the connection areas 10 are solid or dashed according to the mutual covering of the relevant components. Contours of conductors that are only covered by the bit lines 5 that are situated in the topmost plane illustrated are not depicted as concealed contours in this case, but rather as if the bit lines 5 were transparent. This facilitates the overview of the various metallization levels.

In FIG. 7, the connection contacts 8 of the bit lines 5 are hatched in a manner corresponding to FIG. 4. It can be discerned in FIG. 7 that the connection contacts of the bit lines 5 are arranged on the left and on the right laterally with regard to a respective center line of the bit line, with the result that two mutually adjacent columns of the memory elements are coupled via the relevant selection transistors. In this case, the connection contacts 8 are preferably coupled via vertical conductive connections firstly to a first metallization level, in which the connection areas 10 are present. Situated in said metallization level there are also electrical conductors which lead from the vertical conductive connections via the connection contacts 8 to the positions designated by crosses, where a further vertical conductive connection leads into the metallization level of the bit lines 5 that is arranged higher and makes contact with the bit lines 5. If the bit lines 5 are made so broad that they overlap the positions of the connection contacts 8, a single respective vertical connection between the connection contact 8 and the bit line 5 may also suffice.

The connection areas 10 depicted with dash-dotted contours connect the memory elements selected by means of the relevant selection transistor. In the example of FIG. 7, there are six memory elements that are coupled to six successive read/write lines. The connection areas 10 lie over four successive word lines 4. In order to standardize the illustration in FIG. 7, the word lines have been depicted as running under one of the read/write lines, with the result that the arrangement essentially corresponds to the illustration of FIG. 6. In this example, however, each connection area 10 carries six memory elements in contrast to the four memory elements that were illustrated in the exemplary embodiment in accordance with FIGS. 4 and 5.

What is essential in this case is that two successive selection transistors in a row are coupled to next-but-one bit lines. Therefore, between two connection contacts 8 of two bit lines that are arranged in the same row, there is situated a further bit line, the connection contacts 8 of which are fitted in other rows between the corresponding word lines. These bit lines can therefore be used as a reference bit line for determining a reference resistance. A respectively selected word line switches the selection transistors coupled to the selected word line along the relevant row, with the result that the connection contacts 8 of the bit lines running transversely with respect to the selected word line are electrically conductively coupled to the further connection contacts 9 of the memory elements that are opposite the relevant word line. The various memory elements on the associated connection areas 10 can be read separately from one another via the assigned read/write lines. The programming takes place by application of the opposite voltages to the bit line and the read/write line. Therefore, only connection contacts 8 of a portion of the bit lines, in this exemplary embodiment in particular only next-but-one bit lines, are situated in the rows between two mutually adjacent word lines 4. This makes it possible for an intervening bit line, which is free as it were upon selection of a specific word line, to be used as a reference bit line.

Figure 8:
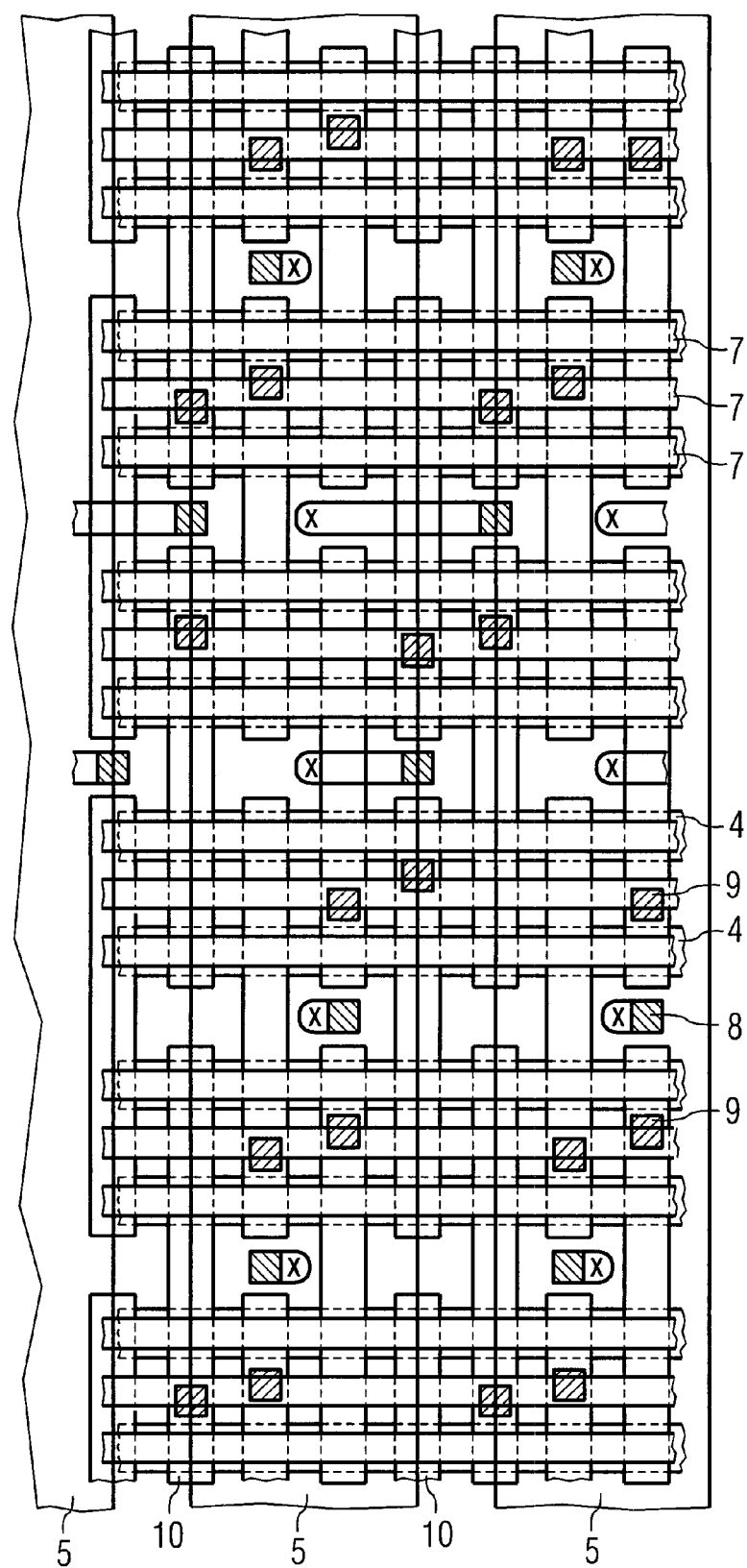
FIG. 8 shows a plan view in accordance with FIG. 4 for an exemplary embodiment in accordance with FIG. 3.

In the exemplary embodiment in accordance with FIG. 8, the selection transistors in four successive columns are coupled to the same bit line 5. The successive selection transistors along a word line in a row are therefore coupled to mutually adjacent bit lines. Consequently, in this exemplary embodiment, an adjacent bit line cannot be coupled as a reference bit line. It is possible, however, to significantly reduce the total number of bit lines required, with the result that the area requirement of the memory cell array is significantly reduced. In this example, too, preferably vertical electrically conductive connections pass from the connection contacts 8 to the first metallization level of the connection areas 10, in which further conductors are structured which lead to the points marked with crosses or to other locations below the relevant bit line. Further vertical electrically conductive connections are present there, by which the conductors are coupled to the bit lines formed in the second metallization level, by way of example. Instead of this, the vertical connections may reach from the connection contacts 8 into the plane of the bit lines. In this case, the bit lines are made so broad or the edges of the bit lines are configured in such a way, for example with attached interconnects, that the bit lines or said attached interconnects cover the connection contacts 8 and can thus be coupled to the connection contacts 8 directly via only one vertical connection. In the exemplary embodiment of FIG. 8, the connection contacts 8 are situated along a respective bit line 5 in accordance with their succession along the bit line one after another in a respective one of the associated four columns of memory elements in the succession of their physical arrangement. Of the four columns, one lies on the left of the center line of the bit line and three lie on the right of the center line of the bit line. However, the arrangement of the bit lines with regard to the coupled columns of memory elements may also be chosen differently, as already mentioned above. Moreover, the four relevant columns can, in principle, be contact-coupled successively in any desired order one after another by means of the connection contacts 8 along a bit line. All that is essential in this case is that different columns from among the columns addressed via a bit line are contact-coupled one after another by means of the successive connection contacts along the bit line.

The number of columns coupled per bit line may be arbitrary, in principle. If very few bit lines and a densest possible arrangement of memory elements are provided, it will be expedient to correspondingly increase the number of memory elements addressed via a respective selection transistor. Via a respectively selected word line and a respectively selected bit line, in this case, a larger number of memory elements are addressed, among which the memory element to be read is selected by the relevant read/write line. The arrangement is to be implemented in any case such that the memory elements along a read/write line are addressed by precisely one pair of a selected bit line and a selected word line. In the selection of a specific word line and a specific bit line, therefore, only one memory element is permitted to be addressed per read/write line. In the case of the arrangements illustrated in FIGS. 7 and 8, this is achieved by virtue of the fact that the connection areas 10 are present only in a column in which the source/drain regions of the selection transistors are also arranged, with the result that a selection transistor addressed by a selected bit line and a selected word line is only coupled to memory elements of the same column that are read via read/write lines in different rows.

The illustrated exemplary embodiments with selection transistors that are not coupled to mutually adjacent bit lines along a respective word line have the advantages, in particular, that during reading the possibility arises of connecting an adjacent free bit line as a reference bit line, whereby the influence of coupled-in noise is reduced. Further, in the case of a plurality of free bit lines, a memory cell can be compared with a plurality of different reference quantities that are switched onto one of the free bit lines (multi-level sensing). In addition, the number of bit lines can be reduced, with the result that the area requirement is reduced. Also, the parasitic currents are reduced owing to the smaller number of selection transistors which are driven by a selected word line. The last-mentioned advantage, in particular, affords the possibility of arranging more cells in the direction of the word lines in the memory cell array. When the selected word line is changed, the bit lines coupled as reference bit lines can undertake the function of a read line, while the previous read line becomes the reference bit line.

The exemplary embodiments described have, per selection transistor, four or six memory elements that are arranged in a column, the groups of mutually associated memory elements not being arranged in the same groups of four or six rows, however. A displacement of these groups of memory elements in the direction of the columns results from the fact that additional word lines are present, which, as so-called "passing word lines", address only a portion of the columns, while the remaining columns are addressed by other word lines. Therefore, the selection transistors addressed by a specific word line do not succeed one another from column to column, but rather have relatively large interspaces in which columns are present whose selection transistors are addressed via word lines arranged in other rows. The exemplary embodiments illustrated reveal the way in which the number of memory elements respectively assigned to a selection transistor and also the arrangement of said memory elements in the respective columns together with the arrangement and number of the bit lines and word lines can be varied in order to make adjacent bit lines available as reference bit lines and/or to reduce the number of bit lines required overall.

What is claimed is:

1. A semiconductor memory device comprising a matrix-like arrangement of memory elements in rows and columns, the semiconductor memory device comprising:

a plurality of selection transistors, each selection transistor having two source/drain regions and an intervening channel controlled by a gate electrode, the selection transistors being arranged in rows and columns, said rows defined as being parallel to word lines and said columns defined as being parallel to bitlines;

a plurality of word lines, each word line being coupled to the gate electrodes of selection transistors arranged in a row;

a plurality of bit lines, each bit line being coupled to a respective source/drain region of a plurality of selection transistors arranged along said bit line, no two of said pairs arranged in the same row, wherein each selection transistor is coupled to precisely one bit line; and a plurality of memory elements formed as resistance memory elements, each one of the memory elements being coupled to only one read/write line, and each memory element being further coupled between its respective read/write line and a source/drain region of a selection transistor that is not coupled to a bit line, wherein memory elements in adjacent columns along a read/write line are coupled to selection transistors that are coupled to different word lines.

2. A semiconductor memory device comprising a matrix-like arrangement of memory elements in rows and columns, the semiconductor memory device comprising:

a plurality of selection transistors, each selection transistor having two source/drain regions and an intervening channel controlled by a gate electrode, the selection transistors being arranged in rows and columns, said rows parallel to word lines and said columns parallel to bit lines;

a plurality of word lines, each word line being coupled to the gate electrodes of the selection transistors in a respective row;

a plurality of bit lines, each bit line being coupled to a respective source/drain region of a plurality of selection transistors, no two of which are arranged in the same row, wherein each selection transistor is coupled to precisely one bit line; and a plurality of memory elements formed as resistance memory elements, the memory elements being coupled row by row to read/write lines, each memory element being coupled between a respective read/write line and a source/drain region of a selection transistor that is not coupled to a bit line, wherein two successive memory elements along a read/write line are coupled to selection transistors that are coupled to different word lines wherein:

the totality of the memory elements is divided into groups comprising the same number of memory elements;

no two memory elements of the same group are coupled to the same read/write line;

all the memory elements of the same group are coupled to the same selection transistor;

the totality of the read/write lines are divided into groups, each group comprising as many read/write lines as there are memory elements coupled to a respective selection transistor; and each group of read/write lines is coupled to groups of memory elements, such that, from all the groups of memory elements of which a memory element is coupled to one read/write line of said group, each memory element is coupled to another read/write line of said group.

3. The semiconductor memory device as claimed in claim 2, wherein a plurality of groups of memory elements are coupled to the same selection transistor.

4. The semiconductor memory device as claimed in claim 2, wherein the memory elements of only one group of memory elements are coupled to each selection transistor.

5. The semiconductor memory device as claimed in claim 4, wherein the read/write lines that are coupled to the memory elements of the same group are coupled to further memory elements in such a way that, from all the groups of memory elements of which a memory element is coupled to one of said read/write lines, each memory element is coupled to another of said read/write lines.

6. The semiconductor memory device as claimed in claim 2, wherein:

the memory elements of the same group are arranged in a same column; and the groups of memory elements present in a respective column are coupled in pairs to selection transistors that are coupled to the same bit line.

7. A semiconductor memory device comprising a matrix-like arrangement of memory elements in rows and columns, the semiconductor memory device comprising:

a plurality of selection transistors, each selection transistor having two source/drain regions and an intervening channel controlled by a gate electrode, the selection transistors being arranged in rows and columns, said rows parallel to word lines and said columns parallel to bit lines;

a plurality of word lines, each word line being coupled to the gate electrodes of the selection transistors in a respective row;

a plurality of bit lines, each bit line being coupled to a respective source/drain region of a plurality of selection transistors, no two of which are arranged in the same row, wherein each selection transistor is coupled to precisely one bit line;

a plurality of memory elements formed as resistance memory elements, the memory elements being coupled row by row to read/write lines, each memory element being coupled between a respective read/write line and that source/drain region of a selection transistor that is not coupled to a bit line, wherein two successive memory elements along a read/write line are coupled to selection transistors that are coupled to different word lines;

wherein the bit lines are coupled to pairs of selection transistors that are coupled to two mutually adjacent word lines; and wherein the selection transistors of adjacent rows along a respective word line are not coupled to mutually adjacent bit lines.

8. The semiconductor memory device as claimed in claim 7, wherein:

the bit lines run along the columns and provide addressing of each of two mutually adjacent columns of memory elements; and the bit lines are provided with connection contacts that each make contact with a source/drain region of the selection transistors of a pair of selection transistors that are arranged in the same column and are coupled to two mutually adjacent word lines.

9. The semiconductor memory device as claimed in claim 8, wherein:

eight word lines are arranged between two connection contacts of a bit line that are present in the same column;

a plurality of word lines are arranged between two connection contacts of a bit line that are present in different columns; and two bit lines adjacent to the relevant bit line have connection contacts that couple said bit lines to selection transistors that are not coupled to those word lines to which the selection transistors coupled to the relevant bit line are coupled.

10. The semiconductor memory device as claimed in claim 9, wherein two word lines are arranged between two connection contacts of the bit line that are present in different columns.

11. The semiconductor memory device as claimed in claim 9, wherein two word lines are arranged between four connection contacts of the bit line that are present in different columns.

12. The semiconductor memory device as claimed in claim 9, wherein two word lines are arranged between eight connection contacts of the bit line that are present in different columns.

13. The semiconductor memory device as claimed in claim 7, wherein:

the bit lines run along the columns and are provided for an addressing of four successive columns of memory elements; and the bit lines are provided with connection contacts that make contact with a source/drain region of the selection transistors of a pair of selection transistors that are arranged in the same column and are coupled to two mutually adjacent word lines.

14. The semiconductor memory device as claimed in claim 13, wherein:

eight word lines are arranged between two connection contacts of a bit line that are present in the same column;

at least two word lines are arranged between two connection contacts of a bit line that are present in different columns; and three columns of memory elements are present between two connection contacts arranged in the same row.

15. The semiconductor memory device as claimed in claim 14, wherein four word lines are arranged between the two connection contacts of the bit line that are present in different columns.

16. The semiconductor memory device as claimed in claim 14, wherein six word lines are arranged between the two connection contacts of the bit line that are present in different columns.

17. The semiconductor memory device as claimed in claim 1, wherein the memory elements comprise resistance memory elements whose electrical resistance is altered during programming by an applied programming current.

18. The semiconductor memory device as claimed in claim 17, wherein:
   the memory elements comprise solid-state ionic memory elements; and
   the read/write line forms an electrode of a memory element coupled to that read/write line.

19. The semiconductor memory device as claimed in claim 8, further comprising a drive circuit integrated in the same substrate as the memory elements, the drive circuit being provided to apply electrical potentials to a selected bit line and to a selected word line for the addressing of a memory element.

20. The semiconductor memory device as claimed in claim 19, wherein the drive circuit is provided to couple a further bit line as a reference bit line with a reference resistance, the further bit line being adjacent to the selected bit line and coupled to none of the selection transistors coupled to the selected word line.

* * * * *